(12) United States Patent
Kuo et al.

(10) Patent No.: US 6,436,800 B1
(45) Date of Patent: Aug. 20, 2002

(54) METHOD FOR FABRICATING A NON-VOLATILE MEMORY WITH A SHALLOW JUNCTION

(75) Inventors: Tung-Cheng Kuo, Yilan Hsien; Shou-Wei Hung, Chilung; Chien-Hung Liu, Taipei; Shyi-Shuh Pan, Kaohsiung, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/990,393

(22) Filed: Nov. 20, 2001

(30) Foreign Application Priority Data

Nov. 5, 2001 (TW) ........................................ 90127398 A

(51) Int. Cl.[7] .............................................. H01L 21/38
(52) U.S. Cl. ........................ 438/558; 938/257; 938/262; 938/303; 938/554
(58) Field of Search .................................. 438/257, 262, 438/267, 303, 558, 554

(56) References Cited

U.S. PATENT DOCUMENTS

| 6,248,633 | B1 | * | 6/2001 | Ogura et al. ................. 438/267 |
| 6,303,959 | B1 | * | 10/2001 | Ratnam ....................... 257/314 |
| 2002/0022354 | A1 | * | 2/2002 | Furukawa et al. .......... 438/586 |

* cited by examiner

Primary Examiner—Trung Dang
(74) Attorney, Agent, or Firm—J.C. Patents

(57) ABSTRACT

A fabrication method for a nonvolatile memory with a shallow junction is described. A gate structure, comprising an electron-trapping layer and a conductive layer, is formed on a substrate. A doped spacer is formed on the sidewall of the gate structure. Buried bit lines are further formed in the substrate beside the gate structure. Thereafter, thermal process is conducted to diffuse the dopants from the doped spacer into the substrate adjacent to the buried bit lines.

20 Claims, 6 Drawing Sheets

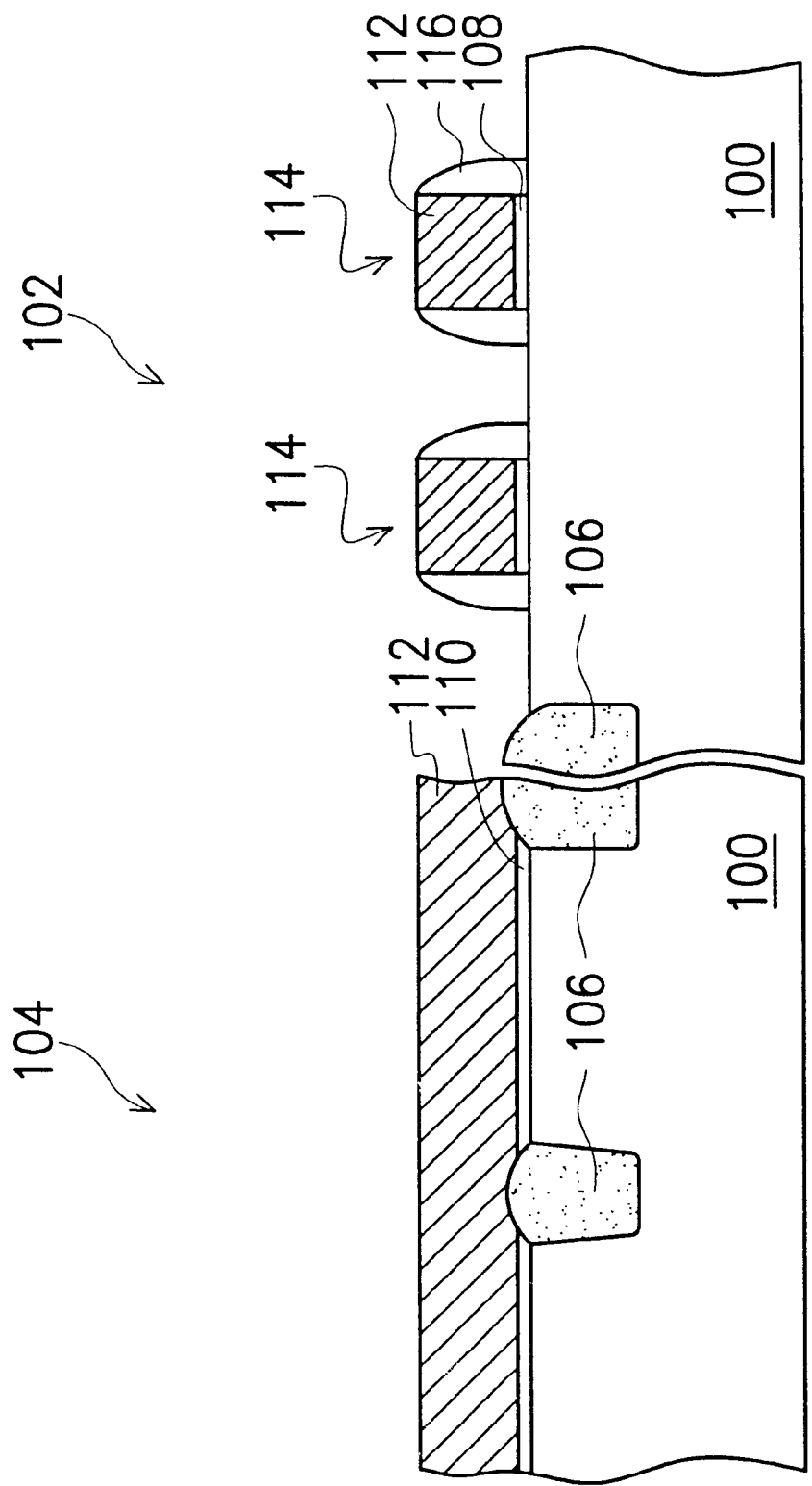

METHOD FOR FABRICATING A NON-VOLATILE MEMORY WITH A SHALLOW JUNCTION

CROSS-REFERENCE TO RELATED APPLICATION

This application claims the priority benefit of Taiwan application serial no. 90127398, filed on Nov. 5, 2001.

BACKGROUND OF THE INVENTION

1. Field of Invention

The present invention relates to a fabrication method for an integrated circuit device. More particularly, the present invention relates to a fabrication method for a non-volatile memory with a shallow junction.

2. Description of Related Art

Memory devices are widely used in a myriad of applications. A memory device typically includes several thousand of memory cells organized in an array, arranged in rows and columns. Memory cells in the same row or the same columns are coupled by a common wiring line, known as a word line. The vertical wiring line related to data transmittance is called a bit line. A common structure of a memory device consists of an array of memory cells positioned at the intersections between an array of parallel buried conducting lines formed in a semiconductor substrate and a perpendicular array of conductive wiring forms above the substrate. A prominent example of such a memory structure is read-only memory (ROM). Read-only memory is a non-volatile semiconductor memory widely used in computer and microprocessor systems for permanently storing information that is repeatedly used. A few samples of read-only memory include programmable ROMs (PROM), erasable programmable ROMs (EPROM), electrically erasable programmable ROMs (EEPROM) and flash EEPROM.

Conventional ROMs are formed by an array of MOSFETs (metal-oxide semiconductor field-effect transistors), each MOSFET being associated with one single memory cell of the ROM device. A typical ROM device is formed with a plurality of substantially parallel spaced diffusion regions which serve as an array of buried bit lines. An array of word lines is formed to extend over the surface of the substrate in a direction generally perpendicular to the array of buried bit lines. The intersections between the bit lines and the word lines are the locations where the memory cells of the ROM device are formed. Most often, the bit lines of the ROM device act as the source/drain regions for the memory field-effect transistors.

As the demand for high-density memory increases, the integrated circuit industry has been progressed to make semiconductor elements smaller and smaller in order to achieve ultra high density semiconductor devices. As transistors disposed on integrated circuits become smaller, transistors with shallow source/drain extensions have become more difficult to manufacture.

Typically, the technique for fabricating a shallow doped region include the used of an ion beam to shallowly implant a dopant into the semiconductor substrate. As is well known to those skilled in the art, the ion implantation process generally operates by ionizing and accelerating dopant atoms into the semiconductor substrate. The dopant atoms are thereby implanted into the semiconductor substrate. The application of the conventional ion implantation techniques in forming source/drain extensions with shallow junction depths make transistors susceptible to short channel effects.

Also the ion implantation process often damages the crystal lattice of the semiconductor substrate being implanted. In the case of a shallow doped region, ion implantation damage generally has a greater adverse affect because the size of the doped region is small. For example, damage to the source and drain regions may result in an increase in the leakage and in a roll-off effect due to the threshold voltage of the transistor, thereby decreasing the performance of the transistor. Moreover, point defects generated in the semiconductor substrate during ion implantation can cause the dopant to diffuse more easily (transient enhanced diffusion, TED). The diffusion often extends the source/drain extensions vertically into the semiconductor substrate. Shallow source/drain extensions are thus difficult to maintain.

SUMMARY OF THE INVENTION

The present invention provides a fabrication method for a non-volatile memory with a shallow junction, wherein the shallow junction is formed by solid state diffusion to prevent the aforementioned problems occurring in the prior art.

The non-volatile memory with a shallow junction formed according to the present invention includes forming a plurality of liner stack structures in a memory cell region, wherein each liner stack structure comprises an electron-trapping layer and a conductive layer. A plurality of doped spacers is formed on the sidewalls of the liner stack structures. Thereafter, buried bit lines are formed in the substrate between the liner stack structures. Thermal process is conducted to cause the dopant to diffuse from the doped spacers into the substrate, adjacent to the buried bit lines.

Accordingly, the shallow junction of the present invention is formed without the conventional ion implantation technique. Damages to the crystal lattice of the semiconductor substrate being implanted are mitigated. An increase in the current leakage and in a roll-off effect due to the threshold voltage of the transistor, leading to a decrease of the transistor's performance is thereby obviated. Moreover, point defects generated in the semiconductor substrate during ion implantation, causing dopant to diffuse more easily and more extensively into the semiconductor substrate are also prevented to maintain the shallow source/drain extensions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A–1E are schematic, cross-sectional views showing the manufacturing of an embedded non-volatile memory according to a preferred embodiment of the present invention.

Figure 1B:
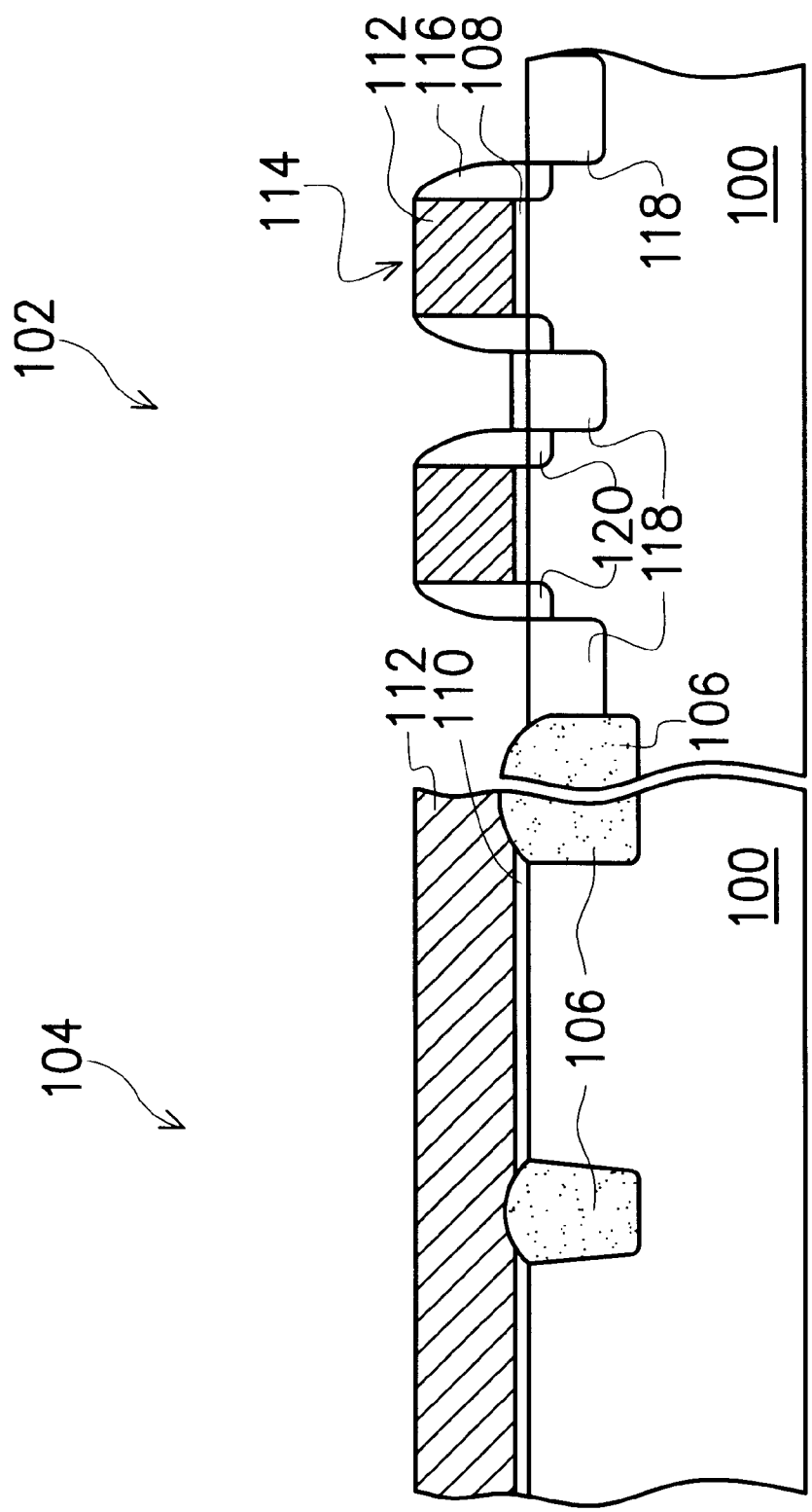
Figure 1C:
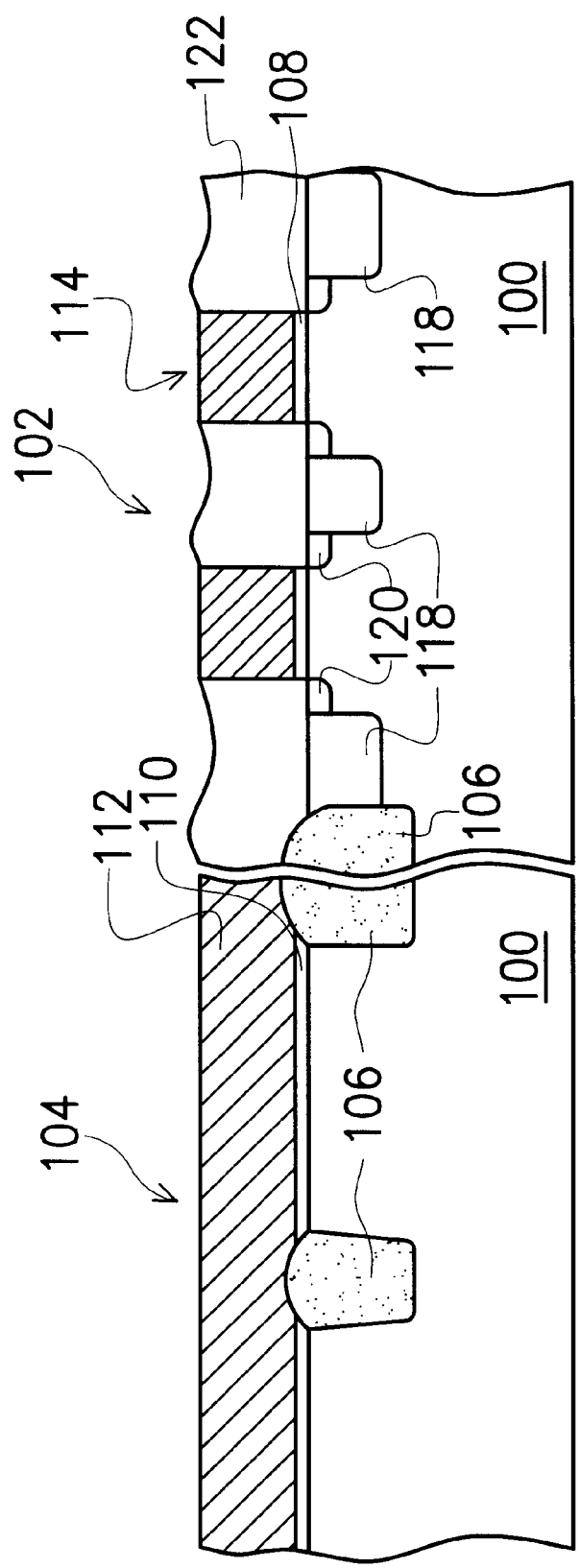
Figure 1D:
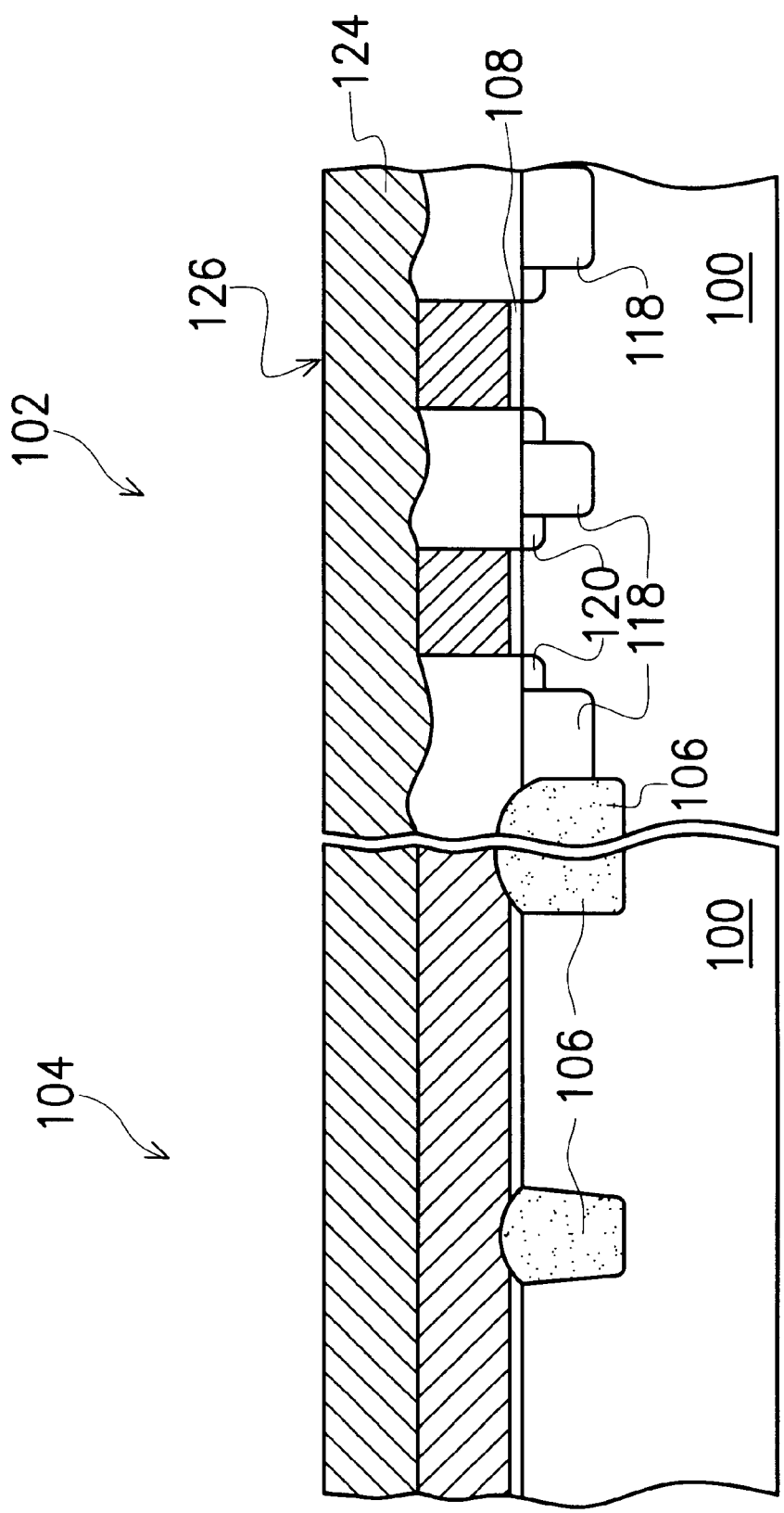
Figure 1E:
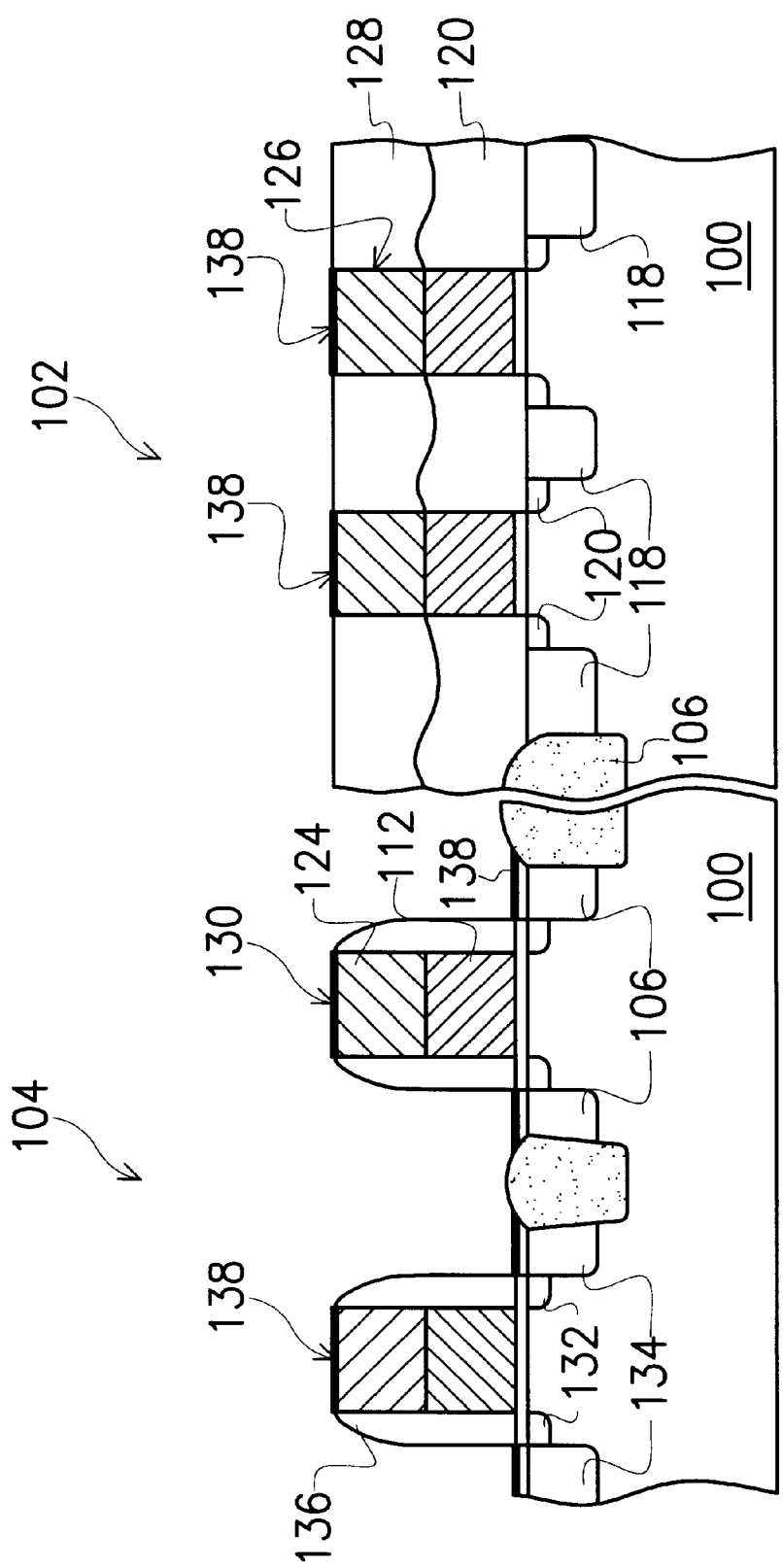
Figure 2:
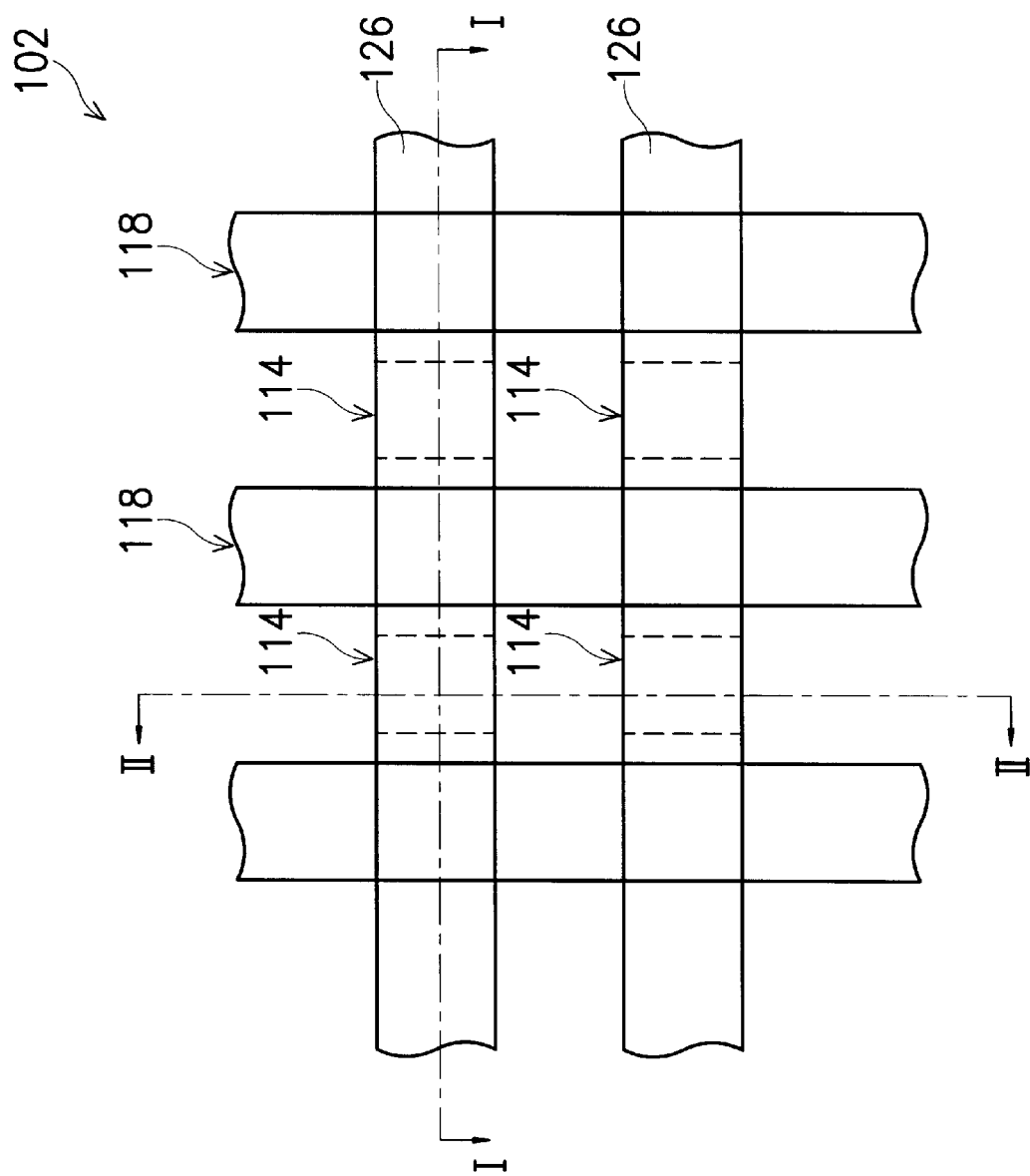

The memory cell region in FIG. 1D is the perspective view of a cutaway part of the memory cell region through the line I—I in FIG. 2. The memory cell region in FIG. 1E, is a perspective view of a cutaway part of the memory cell region of FIG. 2, with the front side thereof showing a cross section cutting through the line II—II in FIG. 2.

FIG. 2 is the equivalent top view of the memory cell region of FIG. 1D.

DESCRIPTION OF THE PREFERRED EMBODIMENTS

The preferred embodiment of the present invention is directed toward the fabrication method for a non-volatile memory with shallow source/drain extensions, wherein problems associated with the prior art methods are substantially eliminated or reduced.

FIGS. 1A to 1E are schematic, cross-sectional views showing the manufacturing of an embedded non-volatile memory according to a preferred embodiment of the present invention. As shown in FIG. 1A, a substrate 100 comprising a memory cell region 102 and a periphery circuit region 104 is provided, wherein isolation between the memory cell region 102 and the periphery circuit region 104, and between other devices, is provided by isolation structures 106. The isolation structures 106 are, for example, field oxide layers or shallow trench isolation structures (STI). An oxide/nitride/oxide (ONO) layer 108 is formed in the memory cell region 102. The ONO layer 108 is formed by, for example, forming sequentially an oxide layer and a silicon nitride layer on the substrate 100 in the memory cell region 102 and the periphery circuit region 104. A wet oxidation process is further conducted to form an oxide layer on the silicon nitride layer. The oxide layer, the silicon nitride layer and the oxide layer are further patterned to form a tunnel oxide layer-a silicon nitride electron trapping layer -an oxide dielectric layer in the memory cell region 102. A gate oxide layer 110 is further formed on the exposed substrate 100 in the periphery circuit region 104. The gate oxide layer 110 is, for example, a thin oxide layer of about 80 Å to about 100 Å thick formed by, for example, thermally oxidizing the substrate 100.

Still referring to FIG. 1A, a polysilicon layer 112 is formed on the substrate 100 of the memory cell region 102 and the peripheral circuit region 104. The polysilicon layer 112 and the ONO layer 108 in the memory cell region 102 are patterned to form a plurality of gate structures 114.

Thereafter, a spacer layer (not shown in Figure), typically a silicon nitride layer, having a dopant disposed therein is formed over the substrate 100 and the gate structures 114 in the memory cell region 102. The dopant, such as arsenic or phosphorous, may be disposed in the spacer layer in a variety of manners. In one embodiment, the spacer layer is first formed over the substrate 100 and then a dopant is implanted into the spacer layer. In an alternate embodiment, the spacer layer is formed by depositing a spacer layer material and the dopant in situ. In another embodiment, the spacer layer is formed by depositing a material having a dopant therein.

Portions of the spacer layer are removed to form doped spacers 116 on the sidewalls of the stack structures 114. Conventional etching techniques may be used to remove these portions of the spacer layer.

Referring to FIG. 1B, a dopant, for example, arsenic, is implanted into the substrate 100 aligned with the spacers 116, to form the buried bit lines 118 in the substrate 100. Thereafter, the dopant in the doped spacers 116 is diffused into the substrate 100 to form the shallow source/drain extensions 120. The source/drain extensions 120 lie adjacent to the buried bit lines 118 and extend a short distance below the gate structures 114.

The dopant is diffused out of the heavily doped spacers 116 by heating the substrate 100. Such diffusion may be accomplished by, for example, rapid thermal processing (RTP), a process in which the substrate 100 is subjected to a relatively high temperature, for example, 1000 degree Celsius, for a relatively short time, for example, 30 to 60 seconds in order to finely control the dopant diffusion.

As shown in FIG. 1C, the doped spacers 116 are subsequently removed. The space between the gate structures 114 is filled with a dielectric material 122. The doped spacers 116 are removed, for example, by wet etching with $H_3PO_4$. The dielectric material 122 that fills the space between the gate structures 114 includes silicon oxide. In an alternative embodiment, the doped spacers 116 are retained and the dielectric material 122 is formed filling the space between the doped spacers 116.

Thereafter, as shown in FIG. 1D, a polysilicon layer 124 is formed in the memory cell region 102 and in the peripheral circuit region 104. The polysilicon layer 124 is formed by, for example, chemical vapor deposition. The polysilicon layer 124 in the memory cell region 102 is then patterned to form the word lines 126. FIG. 2 is the equivalent top view of the memory cell region of FIG. 1D, wherein FIG. 1D is the perspective view of a cutaway part of the memory cell region through the line I—I in FIG. 2.

Continuing to FIG. 1E, there is shown a perspective view of a cutaway part of the memory cell region of FIG. 2, with the front side thereof showing a cross section cutting through the line II—II in FIG. 2, and a cross-sectional view of the peripheral circuit region. As shown in FIG. 1E, a dielectric layer 128 is formed in the memory cell region 102, filling the space between the word lines 126. The dielectric layer 128, for example, an oxide layer is formed by methods such as chemical vapor deposition.

Still referring to FIG. 1E, the polysilicon layer 112 and the polysilicon layer 124 in the peripheral circuit region 104 are defined to form a plurality of transistor gate structures 130. A double implant process is conducted on the substrate 100 in the peripheral circuit region 104 to form lightly doped source/drain regions 132 and heavily doped source/drain regions 134 beside the sidewall spacers 136 of the transistor gates 130.

Salicide layers 138 are subsequently formed on the transistor gate structures 130 and the source/drain regions 134 in the peripheral circuit region 104, and on the word lines 126 in the memory cell region 102. The salicide layers 138 are formed by depositing a metal layer, for example, a tungsten layer, on the substrate 100. A thermal process is then conducted to induce a reaction between the metal layer and the source/drain regions 134, the transistor gate structures 130 and the word lines 126 to form the salicide layers 138 on the respective layers.

According to the present invention, the shallow source/drain extensions for the field effect transistor are formed by solid state diffusion, wherein dopant is diffused out of the heavily doped spacers into the substrate, a short distance below the gate structures. Implantation damages on the crystal lattice of the semiconductor substrate, leading to an increase in the leakage and in a roll-off effect due to the threshold voltage of the transistors are thus obviated. Moreover, the problem of transient enhanced diffusion of the dopant into the semiconductor substrate due to point defects generated by ion implantation in the semiconductor substrate is also prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a shallow source/drain extension in a non-volatile memory, comprising:

providing a substrate on which a plurality of liner stack structures are formed, wherein each liner stack structure comprises an electron-trapping layer and a conductive layer;

forming a plurality of doped spacers on sidewalls of the liner stack structures;

forming a plurality of buried bit lines in the substrate between the liner stack structures; and forming a plurality of source/drain extensions in the substrate under the doped spacers by inducing dopants in the doped spacers to diffuse into the substrate.

2. The method of claim 1, wherein the doped spacers comprise a doped silicon nitride layer.

3. The method of claim 1, wherein the dopants in the doped spacers comprise arsenic ions.

4. The method of claim 1, wherein the dopants in the doped spacers comprise phosphorous ions.

5. The method of claim 1, wherein inducing dopants in the doped spacers to diffuse into the substrate includes performing a thermal process.

6. The method of claim 5, wherein the thermal process includes a rapid thermal process conducted at a temperature of about 1000 degrees Celsius for about 30 to 60 seconds.

7. The method of claim 1, wherein the electron-trapping layer comprises a silicon nitride layer, wherein the silicon nitride layer is sandwiched between two silicon oxide layers.

8. The method of claim 1, wherein the conductive layer comprises doped polysilicon.

9. The method of claim 1, wherein the doped spacer is formed by depositing a spacer material layer over the substrate and implanting the dopant to the spacer material layer subsequently.

10. The method of claim 1, wherein the doped spacer is formed by depositing a spacer material layer over the substrate and depositing the dopant to the spacer material layer in situ.

11. The method of claim 1, wherein the doped spacer is formed by a material that has the dopant therein.

12. A fabrication method for an embedded non-volatile memory, wherein a substrate comprising a memory cell region and a periphery circuit region is provided, comprising:

forming an oxide-nitride-oxide structure in the memory cell region and a gate oxide layer in the periphery circuit region, respectively;

forming a conductive layer on the substrate in the memory cell region and the periphery circuit region;

patterning the oxide-nitride-oxide structure and the conductive layer in the memory cell region to form a gate structure;

forming a doped spacer on a sidewall of the gate structure;

forming a buried bit line in the substrate beside the doped spacer;

forming a shallow source/drain extension below the gate structure by diffusing a dopant from the doped spacer to the substrate;

forming a dielectric layer that fills the space beside the liner stack structure in the memory cell region; and forming a conductive layer on the substrate, wherein the conductive layer is patterned to form a word line in the memory cell region and a transistor gate in the peripheral circuit region, respectively.

13. The method of claim 12, wherein the dopant diffused from the doped spacer includes arsenic ions.

14. The method of claim 12, wherein the dopant diffused from the doped spacer includes phosphorous ions.

15. The method of claim 12, wherein diffusing the dopant from the doped spacer includes performing a rapid thermal process.

16. The method of claim 15, wherein the rapid thermal process is conducted at a temperature of about 1000 degrees Celsius for about 30 to 60 seconds.

17. The method of claim 12, wherein the buried bit line is formed by ion implantation.

18. The method of claim 12, wherein the doped spacer is formed by depositing a spacer material layer over the substrate and implanting the dopant to the spacer material layer subsequently.

19. The method of claim 12, wherein the doped spacer is formed by depositing a spacer material layer over the substrate and depositing the dopant to the spacer material layer in situ.

20. The method of claim 12, wherein the doped spacer is formed by a material that has the dopant therein.

* * * * *